United States Patent
Hayashi (10) Patent No.: US 9,375,923 B2
(45) Date of Patent: Jun. 28, 2016

(54) PIEZOELECTRIC ELEMENT, LIQUID DROPLET DISCHARGING HEAD, LIQUID DROPLET DISCHARGING DEVICE, IMAGE FORMING APPARATUS, AND MANUFACTURING METHOD OF PIEZOELECTRIC ELEMENT

(71) Applicant: Keisuke Hayashi, Kanagawa (JP)

(72) Inventor: Keisuke Hayashi, Kanagawa (JP)

(73) Assignee: RICOH COMPANY, LTD., Tokyo (JP)

( * ) Notice: Subject to any disclaimer, the term of this patent is extended or adjusted under 35 U.S.C. 154(b) by 0 days.

(21) Appl. No.: 14/509,117

(22) Filed: Oct. 8, 2014

(65) Prior Publication Data

US 2015/0097898 A1   Apr. 9, 2015

(30) Foreign Application Priority Data

Oct. 9, 2013   (JP) ................................. 2013-212155

(51) Int. Cl.
| | | |
|---|---|---|
| B41J 2/045 | (2006.01) | |
| B41J 2/14 | (2006.01) | |
| H01L 41/08 | (2006.01) | |
| H01L 41/332 | (2013.01) | |
| H01L 41/29 | (2013.01) | |
| H01L 41/09 | (2006.01) | |
| B41J 2/16 | (2006.01) | |

(52) U.S. Cl.
CPC .............. *B41J 2/14233* (2013.01); *B41J 2/161* (2013.01); *B41J 2/1626* (2013.01); *B41J 2/1645* (2013.01); *B41J 2/1646* (2013.01); *H01L 41/0805* (2013.01); *H01L 41/0973* (2013.01); *H01L 41/29* (2013.01); *H01L 41/332* (2013.01); *Y10T 29/42* (2015.01)

(58) Field of Classification Search
None
See application file for complete search history.

(56) References Cited

U.S. PATENT DOCUMENTS

| | | | |
|---|---|---|---|
| 5,410,208 A * | 4/1995 | Walters et al. ................ 310/334 |
| 7,364,275 B2 | 4/2008 | Lim et al. | |
| 7,603,756 B2 * | 10/2009 | Lim et al. ...................... 29/25.35 |
| 8,770,724 B2 | 7/2014 | Nakayama et al. | |
| 2003/0234595 A1* | 12/2003 | Takahashi et al. ............ 310/324 |
| 2007/0186397 A1* | 8/2007 | Lim et al. ..................... 29/25.35 |
| 2008/0012907 A1* | 1/2008 | Takahashi ....................... 347/68 |
| 2008/0129798 A1* | 6/2008 | Wee et al. ....................... 347/68 |
| 2008/0239017 A1* | 10/2008 | Takabe et al. ................... 347/68 |

(Continued)

FOREIGN PATENT DOCUMENTS

| | | |
|---|---|---|
| JP | 2006159410 A * | 6/2006 |
| JP | 2010-132008 A | 6/2010 |
| JP | 2010-228276 A | 10/2010 |

(Continued)

*Primary Examiner* — Erica Lin
(74) *Attorney, Agent, or Firm* — Oblon, McClelland, Maier & Neustadt, L.L.P.

(57) ABSTRACT

A piezoelectric element includes a vibration plate; a lower electrode; a piezoelectric film; and an upper electrode, which are laminated in the stated order. An electric field is applied to the piezoelectric film by the lower electrode and the upper electrode. A shape of the piezoelectric film near a boundary face between the piezoelectric film and the upper electrode as viewed from a lamination direction of the piezoelectric film and the upper electrode, is substantially the same as a shape of the upper electrode. A width of the piezoelectric film precipitously extends from an end of the boundary face. A thickness of the piezoelectric film in an area in the width of the piezoelectric film where the upper electrode is not formed, is formed to be proportionate to the precipitous extension of the width of the piezoelectric film.

14 Claims, 9 Drawing Sheets

(56) References Cited

U.S. PATENT DOCUMENTS

2009/0244206 A1* 10/2009 Nakayama ...................... 347/68
2010/0079558 A1* 4/2010 Shimada ......................... 347/71

FOREIGN PATENT DOCUMENTS

| | | |
|---|---|---|
| JP | 2012-192541 A | 10/2012 |
| JP | 2014-183054 A | 9/2014 |

* cited by examiner

PIEZOELECTRIC ELEMENT, LIQUID DROPLET DISCHARGING HEAD, LIQUID DROPLET DISCHARGING DEVICE, IMAGE FORMING APPARATUS, AND MANUFACTURING METHOD OF PIEZOELECTRIC ELEMENT

BACKGROUND OF THE INVENTION

1. Field of the Invention

The present invention relates to a piezoelectric element, a liquid droplet discharging head, a liquid droplet discharging device, an image forming apparatus, and a manufacturing method of a piezoelectric element, and more specifically, the present invention relates to a piezoelectric element, a liquid droplet discharging head, a liquid droplet discharging device, an image forming apparatus, and a manufacturing method of a piezoelectric element used in an image forming apparatus such as a printer, a facsimile machine, a copier, a plotter, or a multifunction peripheral in which a plurality of these functions are combined.

2. Description of the Related Art

There is a device for forming images, such as a printer, a facsimile machine, a copier, a plotter, or a multifunction peripheral in which a plurality of these functions are combined. This device is provided with a liquid droplet discharging head for discharging liquid droplets of, for example, ink. This device forms images by discharging ink droplets from the liquid droplet discharging head while conveying a recording medium, and causing the ink droplets to adhere to the recording medium. As a liquid droplet discharging head, there is known a piezoelectric type liquid droplet discharging head provided with a piezoelectric element (see, for example, Patent Documents 1 through 3). In the piezoelectric type liquid droplet discharging head, a plurality of liquid chambers are disposed, respectively corresponding to a plurality of arranged nozzles for discharging ink droplets. At least one of the walls of the liquid chamber is formed by a vibration plate. The vibration plate is caused to deform by a piezoelectric element so that the volume of the liquid chamber changes and ink droplets are discharged.

In order to improve the reliability of the liquid droplet discharging head, the piezoelectric element needs to be prevented from breaking, and the operating life needs to be extended. The breaking of the piezoelectric element is largely classified into two types, namely, cracking and insulation breakdown. Insulation breakdown is relatively easy to avoid by optimizing the design in forming electrodes/piezoelectric elements and in forming a protection film, apart from irregular cases where foreign objects enter from outside.

Patent Document 1 discloses the following technology for the purpose of providing a piezoelectric element having high reliability. That is to say, at least part of a side surface 22 in the short-side direction of a piezoelectric body layer 20, is an irregular surface 23, and the width Wy in the short-side direction of the piezoelectric body layer 20 changes according to the irregular surface 23, from a second electrode 30 toward a first electrode 10.

Patent Document 2 discloses the following technology for the purpose of providing a piezoelectric actuator of an inkjet print head and a method of forming the same. That is to say, a lower electrode formed on top of a vibration plate constituting a top wall of a pressure chamber; a piezoelectric film formed at a position corresponding to the pressure chamber on the lower electrode, such that a space is formed between the surrounding part of the piezoelectric film and the lower electrode; and an upper electrode formed on the piezoelectric film for applying a voltage to the piezoelectric film, are provided. The piezoelectric film may be provided such that the side surface of the piezoelectric film substantially forms a right angle with respect to the top surface of the lower electrode, instead of forming a space at the surrounding part.

Patent Document 3 discloses the following technology for the purpose of providing a liquid jetting head, a liquid jetting device, and an actuator device by which durability is improved. That is to say, a first electrode 60 is formed along a plurality of active parts 320, and at the edge part 66 of a first area 65 corresponding to the active parts 320 of the first electrode 60, there is provided a thick film part 68, which is thicker than a thin film part 69 and thicker than a second area 67 between the first electrode 60 and the active parts 320.

The above conventional technologies of Patent Documents 1 through 3 have similar intentions to that of the present invention in that the piezoelectric element is shaped to have a characteristic feature to increase the reliability and to reduce the concentration of stress. However, the above conventional technologies are different from the present invention of attaining a piezoelectric element in which stress concentration hardly occurs even by being vibrated and which is highly resistant to cracks.

Patent Document 1: Japanese Laid-Open Patent Publication No. 2012-192541
Patent Document 2: Japanese Laid-Open Patent Publication No. 2010-132008
Patent Document 3: Japanese Laid-Open Patent Publication No. 2010-228276

Based on the contents described with reference to Patent Documents 1 through 3, the following is considered. Unlike insulation breakdown, cracks may occur due to various factors and at various timings. Therefore, screening is difficult, and drastic measures for preventing cracks are needed.

Cracks are often caused by concentration of stress due to structural factors, and therefore the structure needs to be formed such that stress is hardly concentrated.

In the case of a discharging method of deforming a piezoelectric film or a piezoelectric body layer that is a thin film having a thickness of several μm (so-called vent mode), the edge part of PZT is apt to receive stress due to the deforming, and is apt to receive stress due to the concentration of an electric field and differences in the intensity of the electric field, at the electrode edge. Therefore, for the purpose of improving reliability, the piezoelectric element needs to be designed from a new, breakthrough viewpoint of alleviating the concentration of stress at the edge part of PZT. Note that PZT forms the piezoelectric layer of the piezoelectric element, and means "a solid solution of lead zirconate ($PbZrO_3$) and titanic acid ($PbTiO_3$)" or "lead zirconate titanate".

SUMMARY OF THE INVENTION

The present invention provides a piezoelectric element, a liquid droplet discharging head, a liquid droplet discharging device, an image forming apparatus, and a manufacturing method of a piezoelectric element, in which one or more of the above-described disadvantages are eliminated.

According to an aspect of the present invention, there is provided a piezoelectric element including a vibration plate; a lower electrode; a piezoelectric film; and an upper electrode. The vibration plate, the lower electrode, the piezoelectric film, and the upper electrode are laminated in the stated order. An electric field is applied to the piezoelectric film by the lower electrode and the upper electrode. A shape of the piezoelectric film near a boundary face between the piezoelectric film and the upper electrode as viewed from a lamination direction of the piezoelectric film and the upper electrode, is substantially the same as a shape of the upper electrode. A width of the piezoelectric film precipitously extends from an end of the boundary face. A thickness of the piezoelectric film in an area in the width of the piezoelectric film where the upper electrode is not formed, is formed to be proportionate to the precipitous extension of the width of the piezoelectric film.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

A description is given, with reference to the accompanying drawings, of embodiments of the present invention. Across all embodiments, constituent elements (members, constituent components, etc.) having the same functions and shapes are denoted by the same reference numerals and redundant descriptions are omitted unless there may be confusion. In order to simplify the drawings and descriptions, there may be cases where a constituent element is omitted from the drawings without descriptions if such a constituent element does not particularly need to be described in the drawing. When a description is given by using constituent elements of patent publications, the reference numerals are given in parenthesis to distinguish them from those of the present embodiment.

In the following description of embodiments of the present invention, the terms "recording device" and "image forming apparatus" of a liquid droplet discharging recording method mean an apparatus that performs recording and image forming by discharging liquid onto media such as paper, thread, textile, cloth, leather, metal, plastic, glass, wood, and ceramics. The term "image forming" means not only providing recording media with significant images such as letters, characters, and figures, but also providing recording media with insignificant images such as patterns (merely discharging liquid droplets onto media). The term "printing" is used as having the same meaning as "image forming".

The term "liquid droplets" is not limited to ink, but ink is a collective term of all kinds of liquid with which "image forming" and "printing" can be performed by turning the liquid into microscopic liquid droplets, including recording liquid, fixing-processing liquid, resin, or liquid. The material of a "recording medium" is not limited to paper; the recording medium means a medium to which liquid droplets can adhere, and may be made of an OHP or cloth, and is used as a collective term including a medium to be subjected to recording, recording paper, a recording sheet, a usable thin sheet, cardboard, a post card, an envelope, or simply a sheet. Furthermore, an image is not limited to a two-dimensional image, but an image may also be a three-dimensional image.

First Embodiment

Figure 1A:
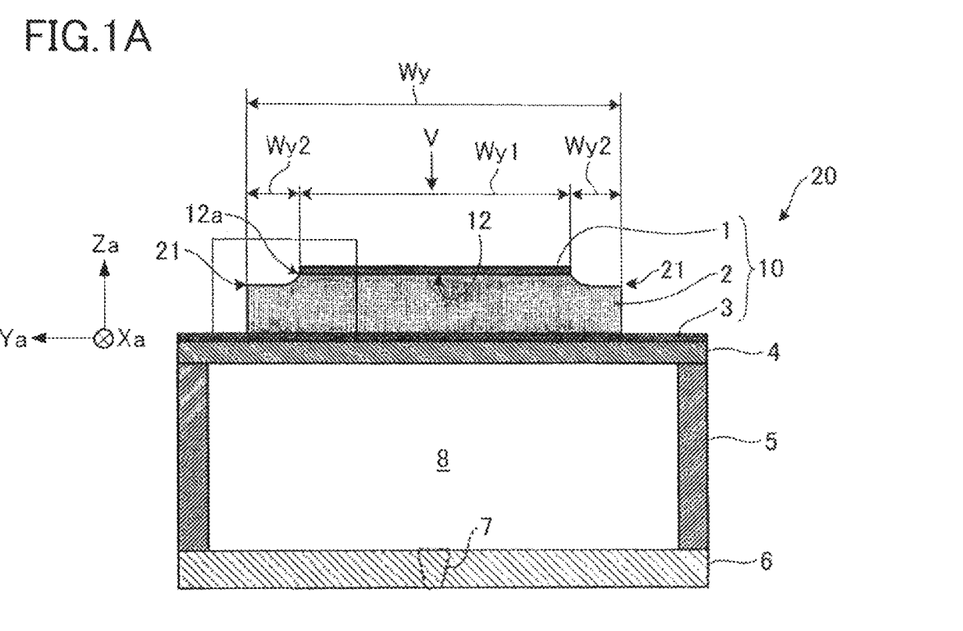
FIG. 1A is an enlarged cross-sectional view of a liquid droplet discharging head provided with a piezoelectric element according to a first embodiment.

With reference to FIGS. 1A through 5, a description is given of a first embodiment of the present invention. FIG. 1A is an enlarged cross-sectional view of a liquid droplet discharging head provided with a piezoelectric element according to the first embodiment, and FIG. 1B is an enlarged cross-sectional view indicating an enlarged view of the part surrounded by a rectangle in FIG. 1A.

As illustrated in FIG. 1A, a piezoelectric element 10 according to the present embodiment has a function of an electromechanical transducer element, and a lower electrode 3, a piezoelectric film 2, and an upper electrode 1 are sequentially laminated on top of a vibration plate 4. In other words, in the piezoelectric element 10, the upper electrode 1 and the lower electrode 3 are formed across the piezoelectric film 2, in close contact on top of and below the piezoelectric film 2 in a sandwich form. The lower electrode 3 is in close contact with the vibration plate 4. An actuator is constituted by the upper electrode 1, the piezoelectric film 2, the lower electrode 3, and the vibration plate 4.

A liquid droplet discharge head 20 according to the present embodiment includes the piezoelectric element 10, and has a lamination structure in which three substrates are laminated, i.e., a nozzle plate 6, partition walls 5, and a protection substrate (not shown) referred to as a support medium or a frame. In the nozzle plate 6, nozzles 7 are formed, including nozzle holes for discharging liquid (for example, ink). In the partition walls 5, a liquid chamber 8 (also referred to as an individual liquid chamber) is formed, in which the nozzle plate 6 is provided at the bottom of the liquid chamber 8 and the vibration plate 4 is provided at the top of the liquid chamber 8. The vibration plate 4 is for transmitting the deformation of the piezoelectric film 2 to the liquid chamber 8.

By forming the liquid chamber 8 with the partition walls 5 and the nozzle plate 6, and by driving the above actuator, i.e., by applying an electric field to the piezoelectric film 2 by the lower electrode 3 and the upper electrode 1, the vibration plate 4 deforms, and liquid droplets can be discharged through the nozzle 7 according to a pressure change in the liquid chamber 8.

The upper electrode 1 and the lower electrode 3 are made of materials such as platinum, iridium, gold, and silver. The vibration plate 4 may be a silicon thermally-oxidized film or may be a lamination structure including an oxidized film, a nitride film, and silicon. The partition walls 5 may be made of silicon, stainless steel, or a composition of silicon and stainless steel. The nozzle plate 6 may be an etching product made of stainless steel, a press product made of stainless steel, a nickel electroform product, or a resin laser processed product.

PZT, which forms the piezoelectric film 2, is made of "a solid solution of lead zirconate ($PbZrO_3$) and titanic acid ($PbTiO_3$)" or "lead zirconate titanate". The piezoelectric film 2 may be formed by spin-coating a sol-gel liquid, forming a film, and shaping the film to correspond to the individual channels by etching; or the piezoelectric film 2 may be formed by directly patterning and applying the sol-gel liquid. Furthermore, a film may be formed by sputtering, and subsequently, the film may be shaped by etching. The piezoelectric film is also referred to as a piezoelectric body, a piezoelectric layer, or an electromechanical transducer film which is a term of a broader concept, and the piezoelectric element is also referred as an electromechanical transducer element which is a term of a broader concept.

Figure 1B:
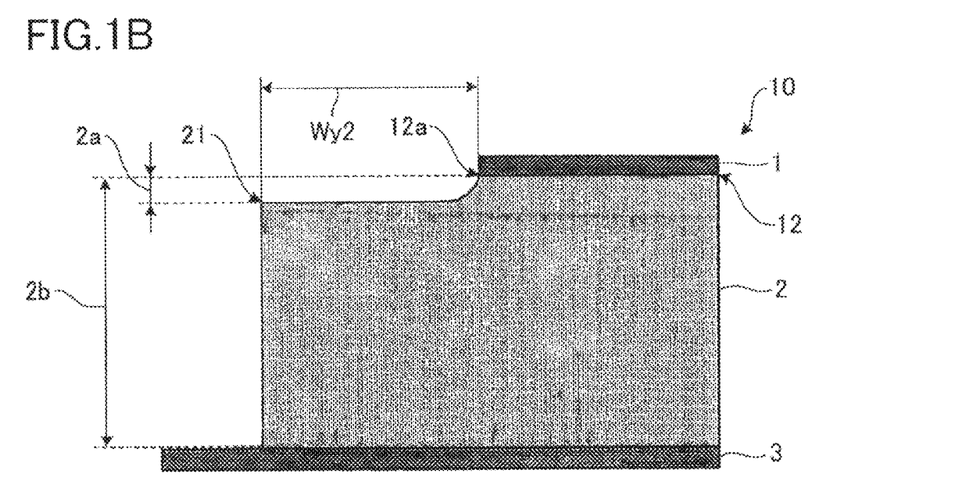
FIG. 1B is an enlarged cross-sectional view indicating an enlarged view of the part surrounded by a rectangle in FIG. 1A.
Figure 2:
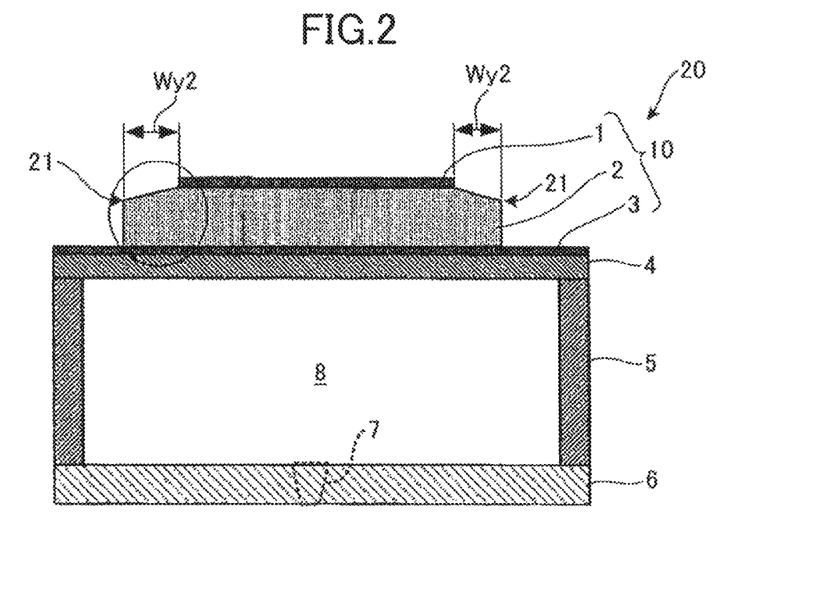
FIG. 2 is an enlarged cross-sectional view of a liquid droplet discharging head provided with a piezoelectric element according to the first embodiment, which is a different example from that illustrated in FIG. 1A.
Figure 3:
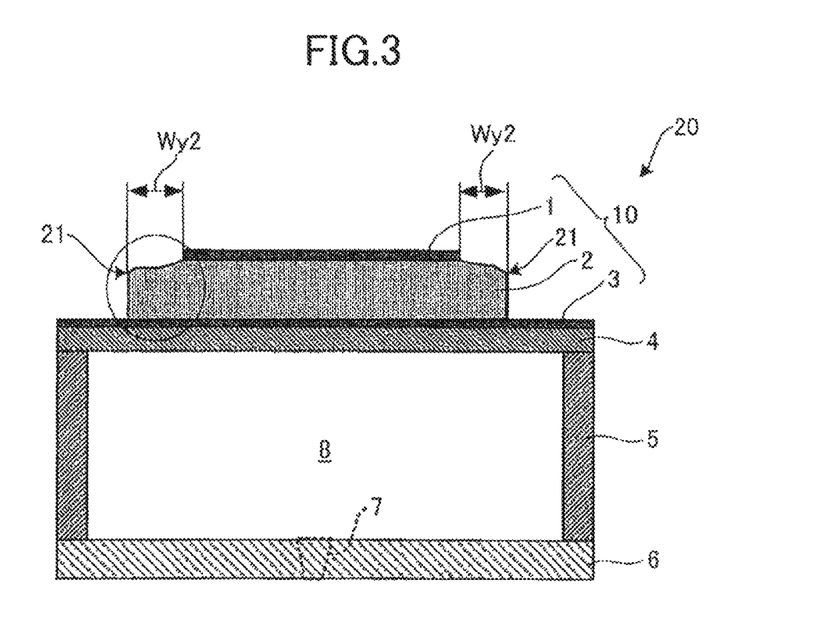
FIG. 3 is an enlarged cross-sectional view of a liquid droplet discharging head provided with a piezoelectric element according to the first embodiment, which is a different example from those illustrated in FIG. 1A and FIG. 2.

The feature of an embodiment of the present invention is the shape of the part surrounded by a rectangular frame in FIG. 1, and the shape surrounded by a circle frame in FIGS. 2 and 3, i.e., the shape of the edge part of the piezoelectric film 2 of the piezoelectric element 10. As illustrated in FIGS. 1A and 1B, at the part where the upper electrode 1 and the piezoelectric film 2 contact each other, a boundary face 12 is formed. The planar-view shape of the piezoelectric film 2 near the boundary face 12 between the piezoelectric film 2 and the upper electrode 1, as viewed in a lamination direction V of the piezoelectric film 2 and the upper electrode 1, is formed to be substantially the same shape as the outline of the upper electrode 1. The upper electrode 1 is not formed on the entire surface of the piezoelectric film 2; the upper electrode 1 is arranged on the inside of edges 21 at the edge parts of the piezoelectric film 2. That is to say, in FIGS. 1A and 1B, Wy2 indicates the width of part of the piezoelectric film 2, which extends from boundary face end 12a toward the outside up to the edge 21 at the edge part of the piezoelectric film 2. The entire width Wy of the piezoelectric film 2 is equal to the distance obtained by adding the width Wy2 of the piezoelectric film 2 on both the left and right sides as viewed in the figures, and the width Wy1 of the part of the piezoelectric film 2 formed to have substantially the same shape as the outline of the upper electrode 1, along the entire periphery of the piezoelectric film 2.

The most significant feature is that the width Wy2 of the piezoelectric film 2 precipitously extends as the distance from the boundary face end 12a between the piezoelectric film 2 and the upper electrode 1 increases, and the thickness of the piezoelectric film 2 within the area of the width Wy2 of the piezoelectric film 2 is formed to be proportionate to the precipitous extension of the width Wy2 of the piezoelectric film 2. That is to say, the width of the piezoelectric film 2 precipitously extends as the distance increases from the upper electrode 1 as viewed in the thickness direction of the piezoelectric film 2 (vertical direction Za), and becomes a fixed width Wy2. As the width precipitously extends, the piezoelectric film 2 having a fixed width Wy2 has a proportionate thickness, and therefore the piezoelectric film 2 has a highly rigid shape.

In FIGS. 1A and 1B, one cross-sectional view of the piezoelectric element 10 of the liquid droplet discharge head 20 is illustrated; however, it is needless to say that the other cross-sections, i.e., the sides around the entire piezoelectric film 2 with respect to the upper electrode 1, have the above characteristic shape. That is to say, the planar-view shape of a piezoelectric element is typically substantially rectangular or oval; however, the sides around the entire piezoelectric film have the above characteristic shape described above in the case of any of these shapes.

Here, a supplemental description is given of the meaning of the term "precipitously", used in "the width Wy2 of the piezoelectric film 2 precipitously extends", with reference to FIGS. 1A and 1B. In FIG. 1B, "the width Wy2 of the piezoelectric film 2 precipitously extends" means that in the thickness direction of the piezoelectric film 2, the ratio of a length 2a from the boundary face 12 between the upper electrode 1 and the piezoelectric film 2 to the edge 21 of the piezoelectric film 2, with respect to a thickness 2b of the piezoelectric film 2, is less than or equal to 10%.

With respect to details of the shape of the edge part of the piezoelectric film 2, FIGS. 1A and 1B illustrate an example where the width Wy2 precipitously extends by a recessed shape of the piezoelectric film 2; however, the present embodiment is not so limited. As in the example illustrated in FIG. 2, the width Wy2 may precipitously extend by a linear shape. Furthermore, as in the example illustrated in FIG. 3, the width Wy2 may precipitously extend by a shape where the edge of the piezoelectric film 2 protrudes upward.

As described above, according to the present embodiment, the following effects are achieved. First, the planar-view shape of the piezoelectric film 2 near the boundary face 12 between the piezoelectric film 2 and the upper electrode 1, as viewed in a lamination direction V of the piezoelectric film 2 and the upper electrode 1, is formed to be substantially the same shape as the outline of the upper electrode 1, and therefore, variations in the intensity of the electric field are suppressed, and stress concentration is suppressed. Second, in areas other than the above boundary face (the part of the width Wy2 extending from the boundary face end 12a to the edge 21 of the piezoelectric film 2), a large area can be secured where the piezoelectric film 2 can remain thick, and therefore the rigidity of the piezoelectric film 2 can be improved, and as a result, residual vibrations are suppressed and high frequency driving can be performed. According to the above, it is possible to attain a piezoelectric element 10 in which stress concentration hardly occurs even by being vibrated and, which is highly resistant to cracks, and a highly reliable liquid droplet discharge head 20 can be attained.

Modification Example 1

Figure 4:
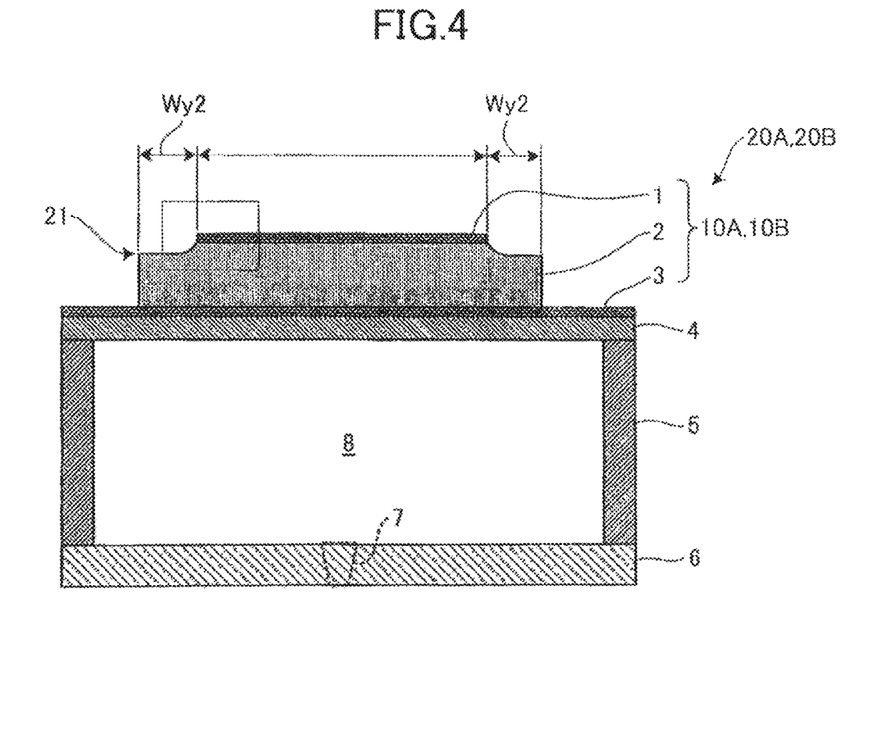
FIG. 4 is an enlarged cross-sectional view of a liquid droplet discharging head according to modification examples 1 and 2.
Figure 5:
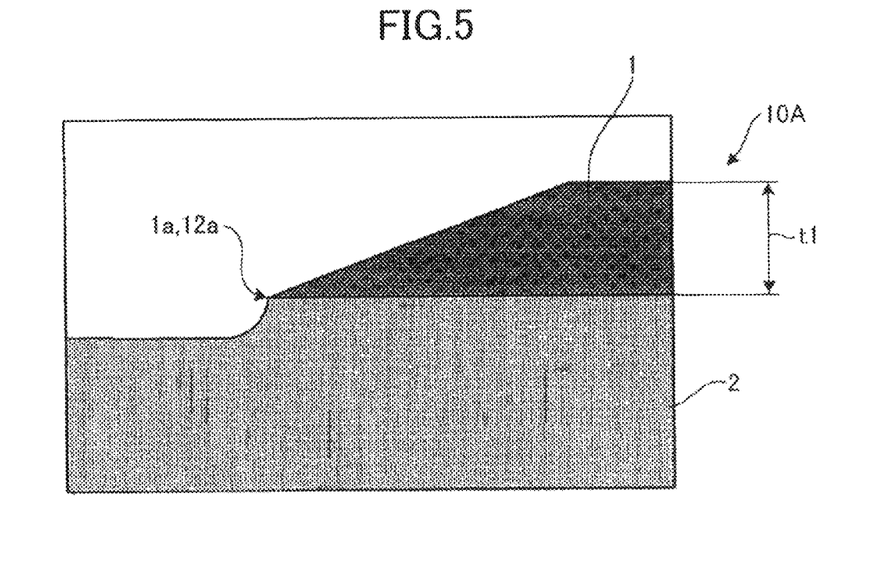
FIG. 5 illustrates an example of modification example 1, which is an enlarged cross-sectional view of an upper electrode edge part and a piezoelectric film in the piezoelectric element in the area surrounded by a rectangle in FIG. 4.
Figure 6:
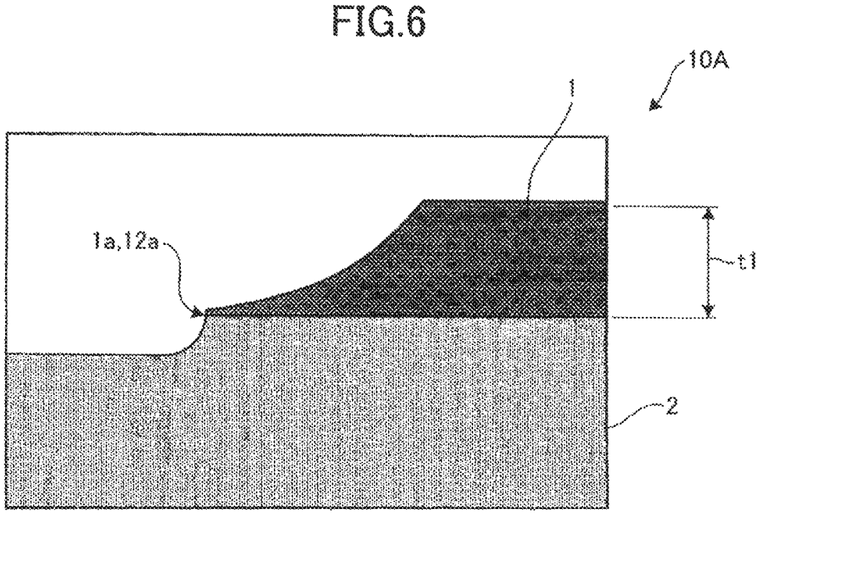
FIG. 6 illustrates a different example of modification example 1 from that of FIG. 5, which is an enlarged cross-sectional view of an upper electrode edge part and a piezoelectric film in the piezoelectric element in the area surrounded by a rectangle in FIG. 4.
Figure 7:
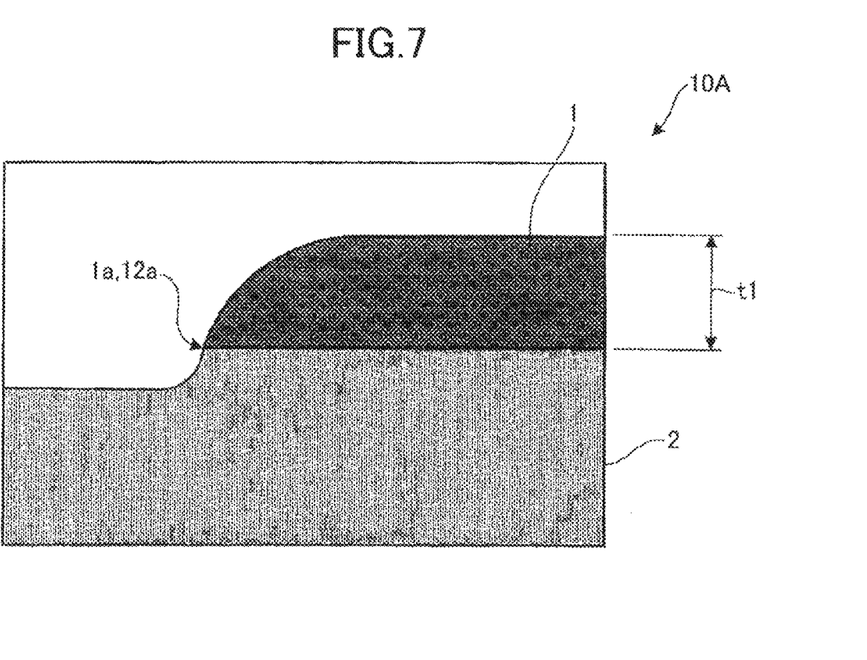
FIG. 7 illustrates a different example of modification example 1 from those of FIGS. 5 and 6, which is an enlarged cross-sectional view of an upper electrode edge part and a piezoelectric film in the piezoelectric element in the area surrounded by a rectangle in FIG. 4.

With reference to FIGS. 4 through 7, a description is given of modification example 1 of the first embodiment. FIG. 4 is an enlarged cross-sectional view of a liquid droplet discharging head according to modification example 1. FIG. 5 illustrates an example of modification example 1, which is an enlarged cross-sectional view of an upper electrode edge part and a piezoelectric film in the piezoelectric element in the area surrounded by a rectangle in FIG. 4. FIG. 6 illustrates yet another example of modification example 1 other than the examples of FIG. 5, which is an enlarged cross-sectional view of an upper electrode edge part and a piezoelectric film in the piezoelectric element in the area surrounded by a rectangle in FIG. 4. FIG. 7 illustrates yet another example of modification example 1 other than the examples of FIGS. 5 and 6, which is an enlarged cross-sectional view of an upper electrode edge part and a piezoelectric film in the piezoelectric element in the area surrounded by a rectangle in FIG. 4. A liquid droplet discharge head 20A according to modification example 1 of FIG. 4 is different from the liquid droplet discharge head 20 according to the first embodiment illustrated in FIG. 1, in that a piezoelectric element 10A is used instead of the piezoelectric element 10. Other than this different point, the liquid droplet discharge head 20A is the same as the liquid droplet discharge head 20 according to the first embodiment.

The piezoelectric element 10A according to modification example 1 is different from the piezoelectric element 10 according to the first embodiment in that a thickness t1 of the upper electrode 1 gradually becomes thin, from the edge part of the upper electrode 1 toward an upper electrode end 1a and the boundary face end 12a. The example illustrated in FIG. 5 indicates a case where the thickness t1 of the upper electrode 1 gradually becomes thin by a linear slope, from the edge part of the upper electrode 1 toward the upper electrode end 1a and the boundary face end 12a. However, the present modification is not so limited. As in the example illustrated in FIG. 6, the thickness t1 of the upper electrode 1 may gradually become thin by a shape protruding downward from the edge part of the upper electrode 1 toward the upper electrode end 1a and the boundary face end 12a. As in the example illustrated in FIG. 7, the thickness t1 of the upper electrode 1 may gradually become thin by a shape protruding upward from the edge part of the upper electrode 1 toward the upper electrode end 1a and the boundary face end 12a.

As described above, in modification example 1, the thickness t1 of the upper electrode 1 gradually becomes thin at the upper electrode end 1a. Thus, according to modification example 1, the binding force of the piezoelectric film 2 by the electrode material can be gradually reduced, and therefore it is possible to reduce the stress concentration at the upper electrode end 1a, and achieve the piezoelectric element 10A and the liquid droplet discharge head 20A in which the displacement efficiency of the piezoelectric film 2 is improved.

Modification Example 2

Figure 8:
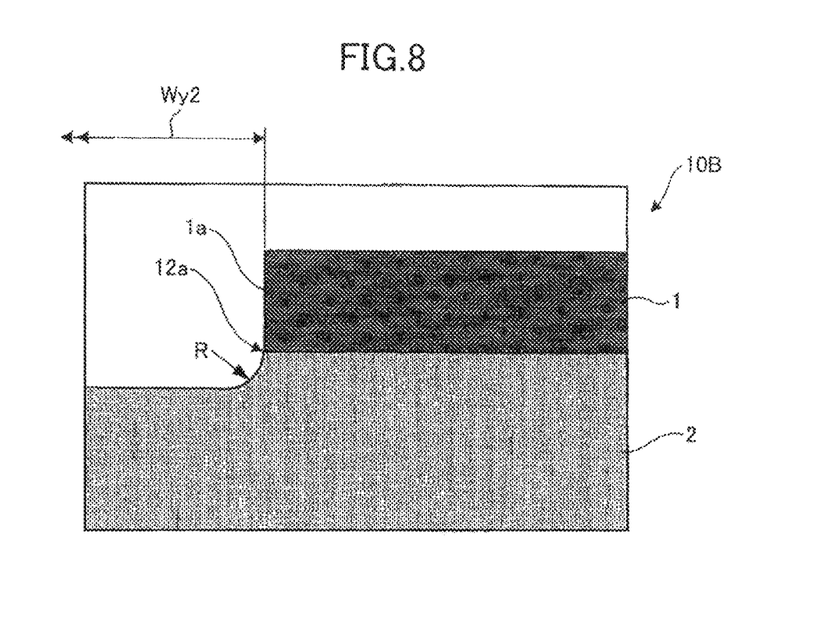
FIG. 8 illustrates an example of modification example 2, which is an enlarged cross-sectional view of an upper electrode edge part and a piezoelectric film in the piezoelectric element in the area surrounded by a rectangle in FIG. 4.

With reference to FIGS. 4 and 8, a description is given of modification example 2 of the first embodiment. FIG. 4 is an enlarged cross-sectional view of a liquid droplet discharging head according to modification example 2. FIG. 8 illustrates an example of modification example 2, which is an enlarged cross-sectional view of an upper electrode edge part and piezoelectric film in the piezoelectric element in the area surrounded by a rectangle in FIG. 4.

A liquid droplet discharge head 20B according to modification example 2 of FIG. 4 is different from the liquid droplet discharge head 20 according to the first embodiment illustrated in FIG. 1, in that a piezoelectric element 10B is used instead of the piezoelectric element 10. Other than this different point, the liquid droplet discharge head 20B is the same as the liquid droplet discharge head 20 according to the first embodiment.

The piezoelectric element 10B according to modification example 2 is different from the piezoelectric element 10 according to the first embodiment in that the shape of the piezoelectric film 2, positioned near the boundary face end 12a between the piezoelectric film 2 and the upper electrode 1, is a curved R shape. In other words, in modification example 2 illustrated in FIG. 8, the shape of the piezoelectric film 2, positioned near the boundary face end 12a between the piezoelectric film 2 and the upper electrode 1, is shaped to form an R shape such that the width Wy2 precipitously extends.

As described above, in modification example 2, the degree of the change in the deformation of the piezoelectric film 2 is reduced. Thus, it is possible to achieve the piezoelectric element 10B and the liquid droplet discharge head 20B in which the occurrence of stress concentration is suppressed. It is needless to say that modification example 2 is also applicable to modification example 1.

Modification Example 3

Figure 9:
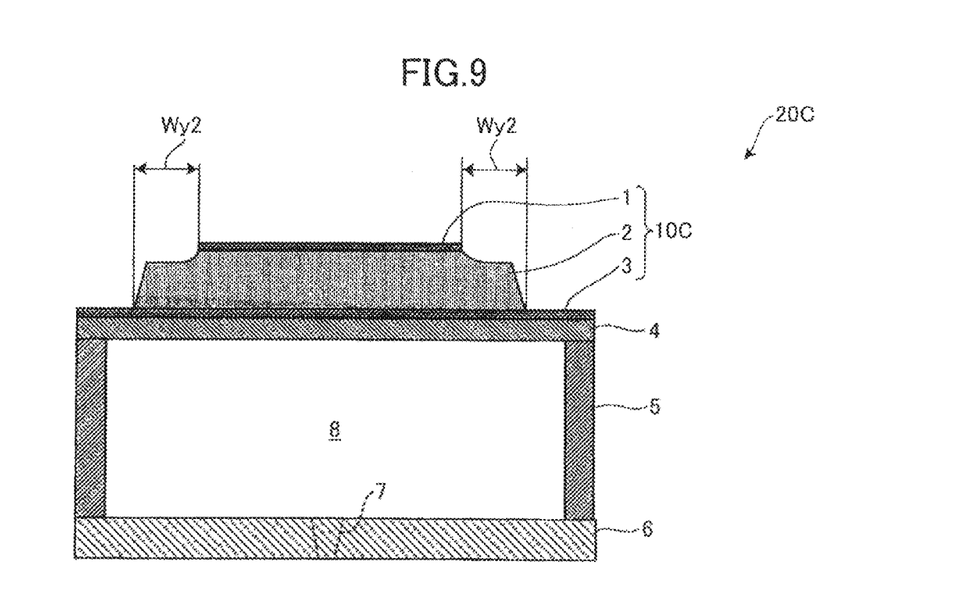
FIG. 9 is an enlarged cross-sectional view of a liquid droplet discharging head according to modification example 3.

With reference to FIG. 9, a description is given of modification example 3 of the first embodiment. FIG. 9 is an enlarged cross-sectional view of a liquid droplet discharging head according to modification example 3.

A liquid droplet discharge head 20C according to modification example 3 of FIG. 9 is different from the liquid droplet discharge head 20 according to the first embodiment illustrated in FIG. 1, in that a piezoelectric element 10C is used instead of the piezoelectric element 10. Other than this different point, the liquid droplet discharge head 20C is the same as the liquid droplet discharge head 20 according to the first embodiment.

The piezoelectric element 10C according to modification example 3 is different from the piezoelectric element 10 according to the first embodiment in that at the edge part of the piezoelectric film 2, the width Wy2 of the piezoelectric film 2 is formed to have a slope that extends from the upper electrode 1 side toward the lower electrode 3 side. Note that the example of FIG. 9 indicates a slope that extends from the upper electrode 1 side toward the lower electrode 3 side by a linear tilt. However, the example is not so limited, and the piezoelectric film 2 may be formed to have a slope that protrudes upward or downward, or that slightly curves.

As described above, in modification example 3, by the above configuration, it is possible to achieve the piezoelectric element 10C and the liquid droplet discharge head 20C in which the deformation binding force caused by an inactive part at the edge part of the piezoelectric film 2 is suppressed, and the displacement efficiency is improved. It is needless to say that modification example 3 is also applicable to modification examples 1 and 2.

Second Embodiment

Figure 10:
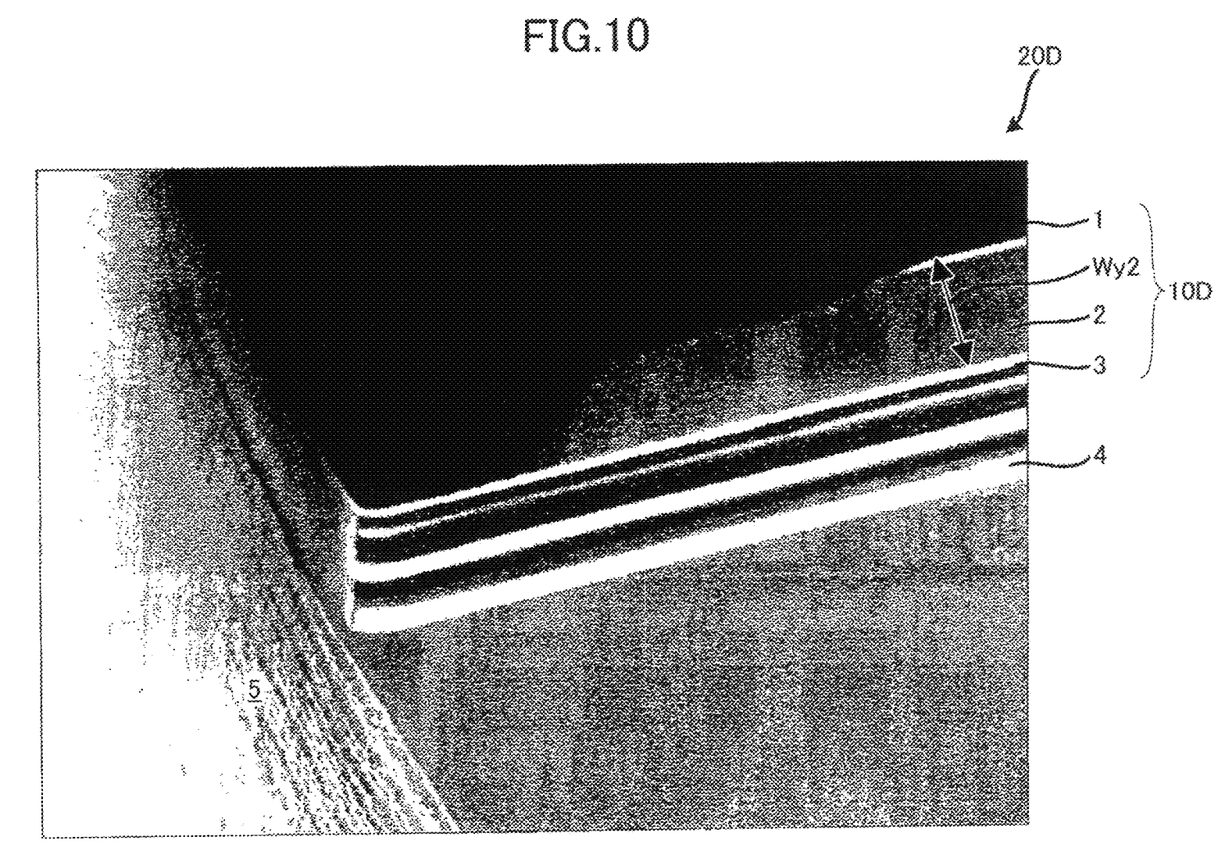
FIG. 10 is a scanning electron microscope (SEM) photograph of relevant parts of the actual liquid droplet discharging head according to a second embodiment.
Figure 11:
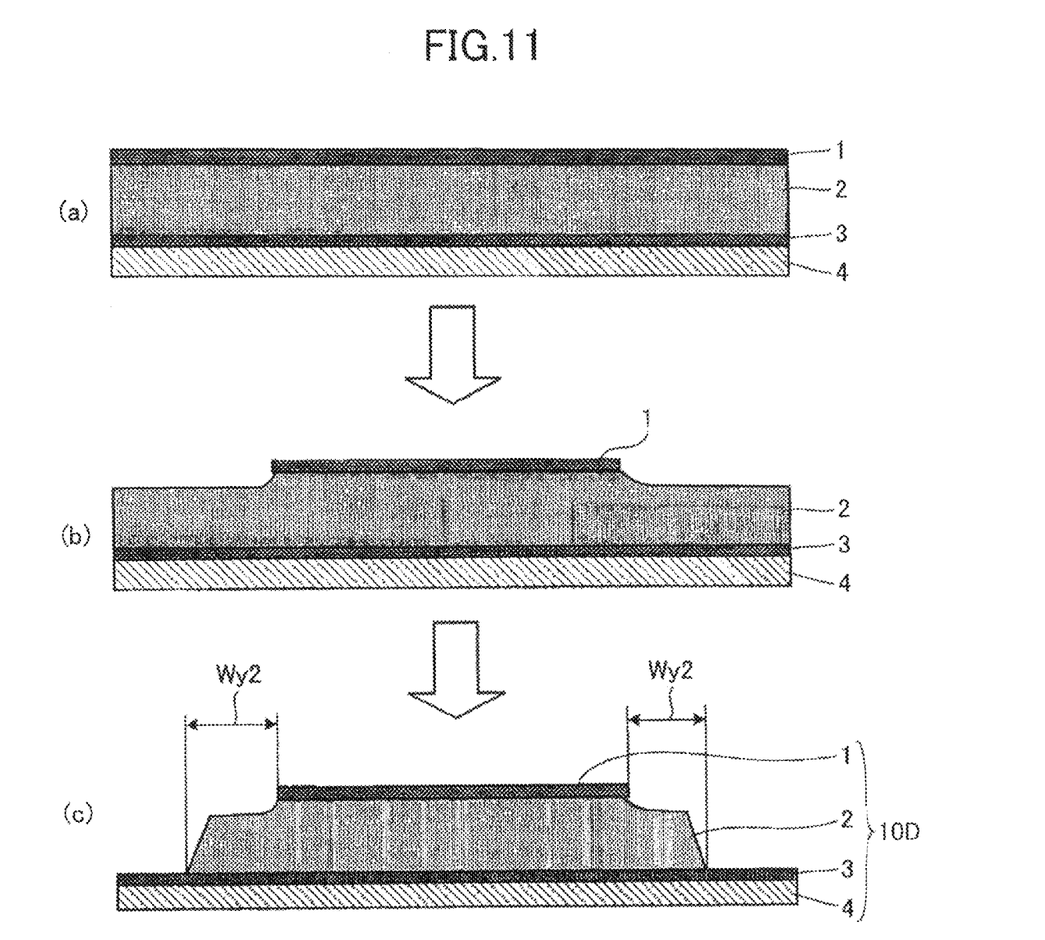
FIG. 11 is a procedural diagram for describing a method of manufacturing a piezoelectric element according to the second embodiment.

With reference to FIGS. 10 and 11, a description is given of a second embodiment of the present invention. FIG. 10 is a scanning electron microscope (SEM) photograph of relevant parts of the actual liquid droplet discharging head according to the second embodiment. FIGS. 11 (a), (b), and (c) provide a procedural diagram for describing a method of manufacturing a piezoelectric element according to the second embodiment.

FIGS. 10 and 11 illustrate a piezoelectric element 10D and a liquid droplet discharge head 20D according to the second embodiment, in which the above-described first embodiment and modification examples 1 through 3 are all implemented. It can be observed in FIG. 10 how the width Wy2 of the piezoelectric film 2 precipitously extends, and how the thickness of the upper electrode 1 gradually becomes less at the upper electrode end 1a. Furthermore, it can be observed in FIG. 10 how the shape of the edge part of the piezoelectric film 2 spreads toward the bottom (the shape of the edge part is formed to have a slope that spreads from the upper electrode 1 side toward the lower electrode 3 side). Note that the width Wy2 of the piezoelectric film 2 has the characteristic shape as described above, along the entire periphery of the piezoelectric film 2 sticking out from the upper electrode 1. However, in FIG. 10, as a matter of simplifying the figure, the width Wy2 of the piezoelectric film 2 is only partially formed, and the top left part in FIG. 10 is intentionally left without etching.

Next, with reference to FIG. 11, a description is given of a method of manufacturing a piezoelectric element according to the second embodiment. First, as illustrated in FIG. 11(a), the lower electrode 3 is formed on the vibration plate 4 by sputtering, and then a piezoelectric body layer is formed by sputtering or spin coating to form the piezoelectric film 2. Then, the upper electrode 1 is formed on the piezoelectric film 2 by sputtering. Subsequently, as illustrated in FIG. 11(b), when etching the upper electrode 1, the lithography and etching conditions are devised to also partially etch the piezoelectric film 2, and finally, as illustrated in FIG. 11(c), the piezoelectric film 2 is etched. As described above, in the process of etching the upper electrode 1, over-etching is performed so that the piezoelectric film 2 is also etched, thereby forming a desired shape.

As described above, according to the second embodiment, when etching the upper electrode 1, the piezoelectric film 2 is etched together with the upper electrode 1, and therefore the desired shape can be efficiently formed.

Third Embodiment

Figure 12:
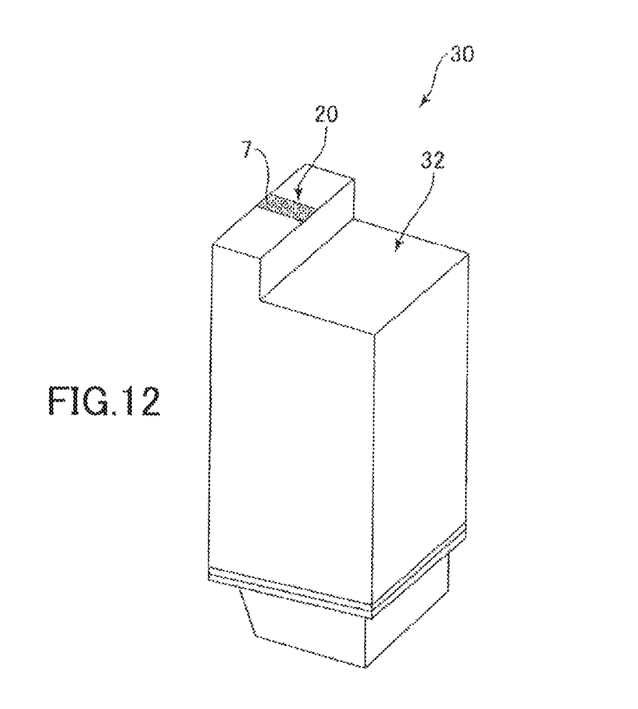
FIG. 12 is an external perspective view of a liquid droplet discharging device according to a third embodiment.

With reference to FIG. 12, a description is given of an ink cartridge, as an example of a liquid droplet discharging device according to a third embodiment. FIG. 12 is an external perspective view of the liquid droplet discharging device according to the third embodiment. A specific example of a liquid droplet discharging device 30 is an ink cartridge storing ink of an appropriate color, as the liquid to be discharged.

The liquid droplet discharging device 30 includes the liquid droplet discharge head 20 according to the first embodiment provided with the nozzles 7 as illustrated in FIG. 1, and a liquid tank 32 storing liquid to be supplied to the liquid droplet discharge head 20, which are integrated to form a single body.

According to the third embodiment, the liquid droplet discharging device 30 has a highly reliable liquid droplet discharge head 20 installed, including a piezoelectric element 10 in which stress concentration hardly occurs even by being vibrated and which is highly resistant to cracks, and therefore a highly reliable liquid droplet discharging device 30 can be provided. In the case of the liquid droplet discharging device 30 in which the liquid droplet discharge head 20 is integrated with an ink tank to form a single body, the cost reduction in the liquid droplet discharge head 20 directly leads to the cost reduction in the entire liquid droplet discharging device 30, and therefore it is possible to reduce the costs of the liquid droplet discharging device 30 in which the head and the tank are integrated to form a single body. Note that the liquid droplet discharge head 20 to be installed is not limited to the above; it is needless to say that any of the liquid droplet discharge heads 20A through 20C according to modification examples 1 through 3 or the liquid droplet discharge head 20D according to the second embodiment may be applied.

Fourth Embodiment

Figure 13:
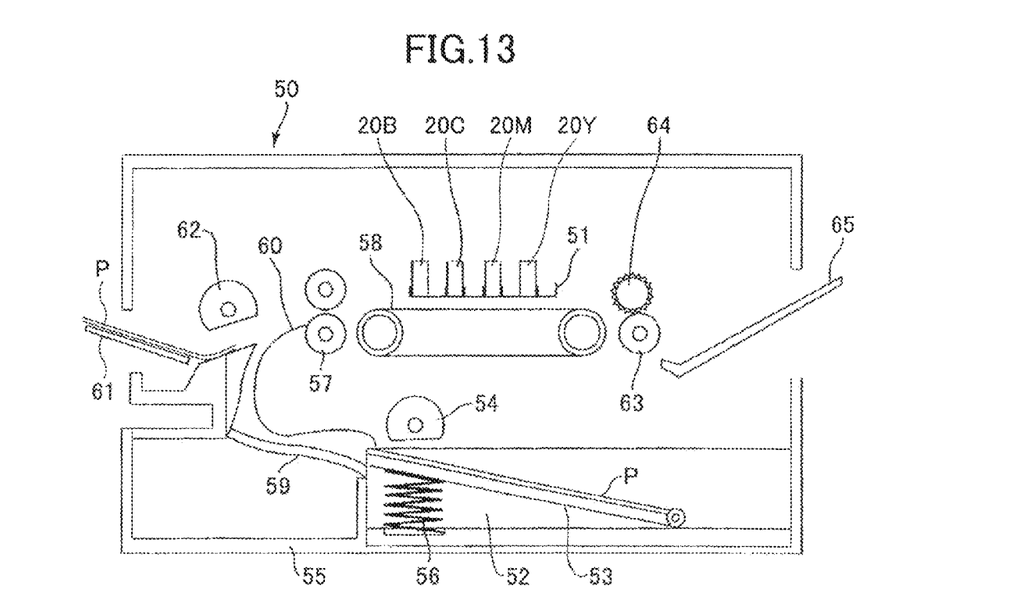
FIG. 13 is a schematic partial cross-sectional front view of the mechanism part of a recording device according to a fourth embodiment.

With reference to FIG. 13, a description is given of an image forming apparatus according to a fourth embodiment. FIG. 13 is a schematic partial cross-sectional front view of the mechanism part of a recording device as an example of the image forming apparatus according to the fourth embodiment.

A recording device 50 illustrated in FIG. 13 includes liquid droplet discharge heads 20B, 20C, 20M, and 20Y corresponding to the four colors of black (B), cyan (C), magenta (M), and yellow (Y), which constitute the liquid droplet discharge head 20 according to the first embodiment. The recording device 50 is a so-called line type recording device. The liquid droplet discharge heads 20B, 20C, 20M, and 20Y are only different in terms of the color of the liquid to be discharged, and otherwise have the same configuration, and are therefore described without accompanying the reference numeral with the letter expressing the color of the liquid. An example of the recording device 50 is an inkjet recording device provided with an inkjet head for discharging ink of the respective colors.

Each liquid droplet discharge head 20 includes a maintenance mechanism device 51, which moves to a position facing the nozzle faces of the liquid droplet discharge head 20 when performing maintenance operations such as a purge process and a wiping process. The liquid droplet discharge head 20 is a line type head including a nozzle row having a length that is greater than or equal to the printing area width of a recording medium. A sheet feeding tray 52 includes a pressurizing plate 53, and a feed rotating body 54 for feeding a recording sheet P attached to a base 55. The pressurizing plate 53 is rotatable around a rotating shaft attached to the base 55, and receives a pressing force (meaning to be pressed by pressure) from the feed rotating body 54 by a pressurizing plate spring 56. At the part of the pressurizing plate 53 facing the feed rotating body 54, there is provided a separation pad (not shown) made of a material having a high friction coefficient such as artificial leather, for the purpose of preventing multiple feeding of the recording sheets P. Furthermore, a release cam (not shown) is provided for releasing the abutting (meaning to abut and make contact) of the pressurizing plate 53 and the feed rotating body 54.

In the recording device 50, in a standby state, the release cam presses down the pressurizing plate 53 to a predetermined position. Accordingly, the abutting of the pressurizing plate 53 and the feed rotating body 54 is released. In this state, when the driving force of a roller 57 is transmitted to the feed rotating body 54 and the release cam by a gear, etc., the release cam separates from the pressurizing plate 53 and the pressurizing plate 53 rises so that the recording sheet P abuts the feed rotating body 54. Then, according to the rotation of the feed rotating body 54, the recording sheet P is picked up and starts to be fed, and one recording sheet P is separated at a time from a stack of sheets P by a separation claw (not shown). The feed rotating body 54 rotates to send the recording sheet P to a platen 58. The recording sheet P passes through a pair of guides 59, 60 and is guided to the conveying roller 57 and conveyed to the platen 58. Subsequently, the recording device 50 shifts to a standby sheet again in which the abutting of the recording sheet P and the feed rotating body 54 is released, and the driving force from the conveying roller 57 is cut off.

Furthermore, the recording sheet P that is supplied from a manual feed tray 61 is also conveyed to the platen 58 from the conveying roller 57 by a feed rotating body 62. On the recording sheet P that has been conveyed to the platen 58, a desired image is formed by the liquid droplet discharge heads 20B, 20C, 20M, and 20Y based on signals controlling the sheet conveyance speed and the timing of liquid droplet discharging. The recording sheet P on which an image has been recorded is conveyed by a sheet eject roller 63 and a spur 64, and is ejected to a sheet eject tray 65.

According to the fourth embodiment, the recording device 50 has a highly reliable liquid droplet discharge head 20 installed, including a piezoelectric element 10 in which stress concentration hardly occurs even by being vibrated and which is highly resistant to cracks, and therefore a highly reliable recording device 50 having a long operating life can be provided. Furthermore, by using the line type liquid droplet discharge heads 20B, 20C, 20M, and 20Y, a desired image can be quickly formed on the recording sheet.

Note that also in the recording device 50 according to the fourth embodiment, the liquid droplet discharge head 20 to be installed is not limited to the above; it is needless to say that any of the liquid droplet discharge heads 20A through 20C according to modification examples 1 through 3 or the liquid droplet discharge head 20D according to the second embodiment may be applied.

Figure 14:
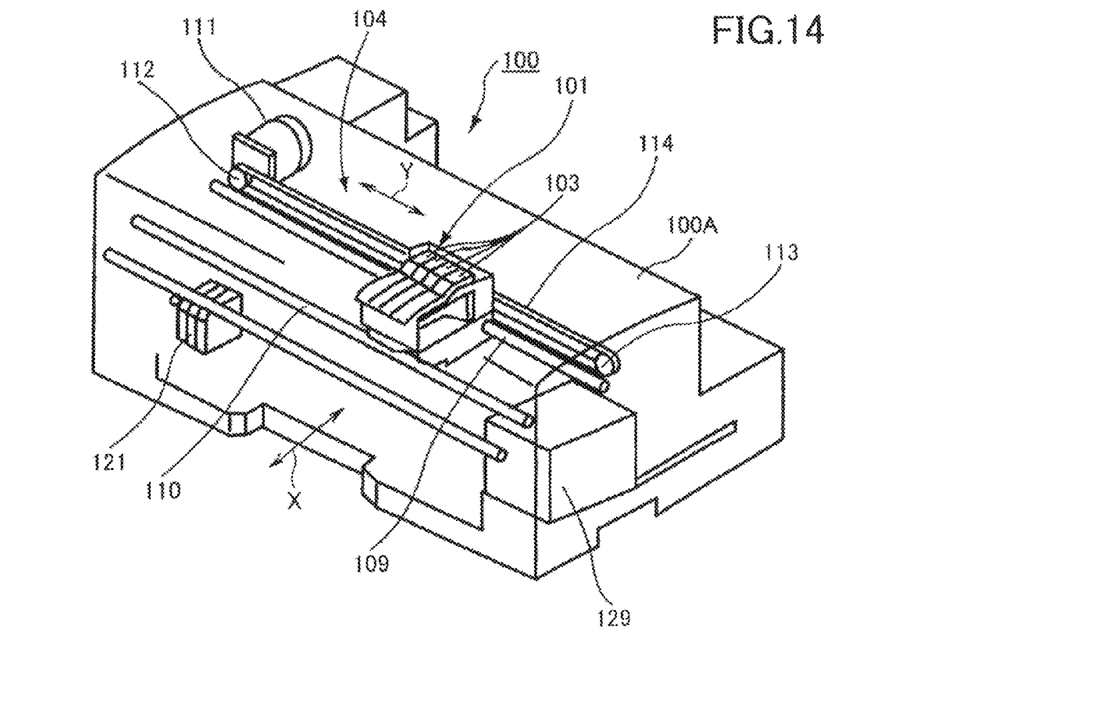
FIG. 14 is a perspective view of another recording device according to the fourth embodiment of a different method from that of the recording device illustrated in FIG. 13.
Figure 15:
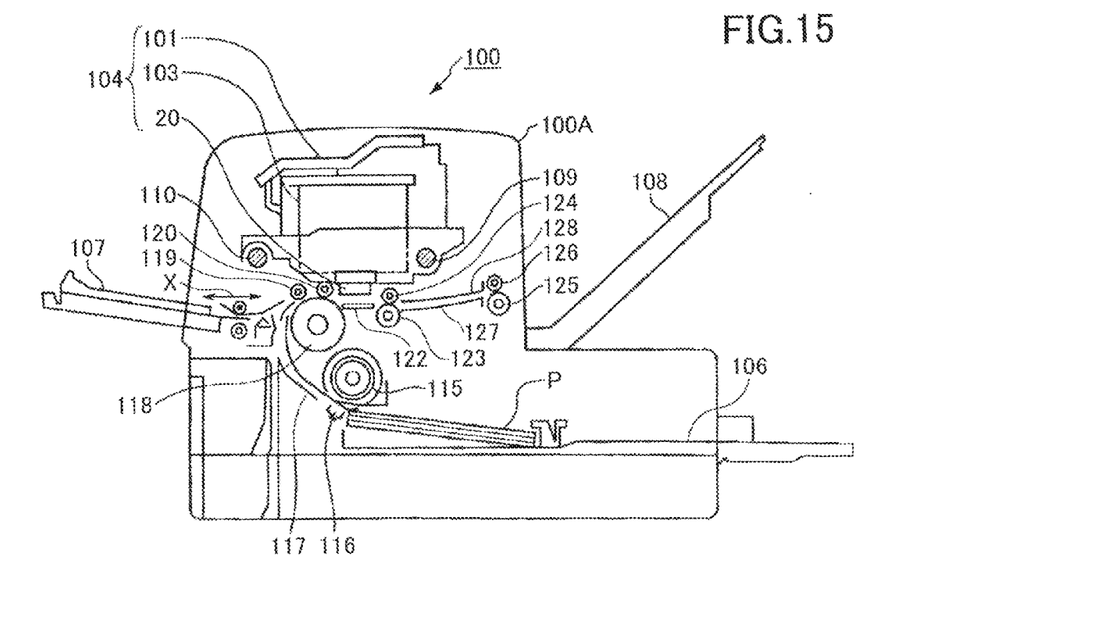
FIG. 15 is a schematic partial cross-sectional front view of the mechanism part of the recording device of FIG. 14.

Next, with reference to FIGS. 14 and 15, a description is given of a recording device 100 as an example of an image forming apparatus, which is of a different method from that of the recording device 50 illustrated in FIG. 13. FIG. 14 is a perspective view of another recording device according to the fourth embodiment of a different method from that of the recording device 50 illustrated in FIG. 13; and FIG. 15 is a schematic partial cross-sectional front view of the mechanism part of a recording device of FIG. 14.

In the recording device 100 illustrated in FIGS. 14 and 15, the liquid droplet discharge head 20 according to the first embodiment is installed. In both of these diagrams, Y indicates a main-scanning direction and X indicates a sub-scanning direction that is orthogonal to the main-scanning direction.

As illustrated in FIGS. 14 and 15, the recording device 100 is a so-called serial-type inkjet recording device, and includes a print mechanism unit 104. The print mechanism unit 104 includes, inside a recording device main body 100A, a carriage 101 that is movable in the main-scanning direction Y, a liquid droplet discharge head 20 installed on the bottom side of the carriage 101, and an ink cartridge 103 acting as an ink supply unit for supplying ink to the liquid droplet discharge head 20.

At the bottom part of the recording device main body 100A, there is provided a sheet feeding cassette 106 in which multiple recording sheets P can be stacked from the left front as viewed in FIG. 15, and the sheet feeding cassette 106 can be drawn out from and pushed into the recording device main body 100A. Above the sheet feeding cassette 106, there is provided a manual feed tray 107 for manually feeding a sheet, and the manual feed tray 107 can pivot/open and close with respect to the recording device main body 100A. The recording sheet P which is fed from the sheet feeding cassette 106 or the manual feed tray 107 is taken in, and a predetermined image is recorded on the recording sheet P by the print mechanism unit 104, and then the recording sheet P is ejected to a sheet eject tray 108 attached to the back side of the recording device 100. Note that the sheet feeding cassette 106 is not limited to the above; a sheet feeding tray may be used.

The print mechanism unit 104 holds the carriage 101 by a main guide rod 109 that is a guide member that is bridged (horizontally bridged) between the side plates on the left and right (not shown), and a sub guide rod 110, such that the carriage 101 is slidable in the main-scanning direction Y (slides by being in contact with the rods). In the carriage 101, the liquid droplet discharge heads 20 for discharging ink droplets of the respective colors of black (B), cyan (C), magenta (M), and yellow (Y), are arranged such that the plurality of ink discharging outlets (nozzles) are in a direction orthogonal to the main-scanning direction Y, and the ink discharging direction is facing downward.

In the carriage 101, the respective ink cartridges 103 for supplying ink of the respective colors to the liquid droplet discharge heads 20, are attached in a replaceable manner. The ink cartridge 103 has an atmosphere outlet connecting to the atmosphere provided at the top, a supply outlet provided at the bottom for supplying ink to the liquid droplet discharge heads 20, and a porous body inside filled with ink. Accordingly, the ink cartridge 103 is able to maintain the ink to be supplied to the liquid droplet discharge head 20 at a slight negative pressure, by the capillary force of the porous body. Furthermore, in this example, the liquid droplet discharge heads 20 of the respective colors are used; however, there may be a single liquid droplet discharge head having nozzles for discharging ink droplets of the respective colors.

The back side of the carriage 101 (downstream side in the recording sheet conveying direction) is supported in a slidable manner by the main guide rod 109, and the front side of the carriage 101 (upstream side in the recording sheet conveying direction) is placed on the sub guide rod 110 in a slidable manner. In order to move this carriage 101 in the main-scanning direction Y, a timing belt 114 is fixed to the carriage 101. The timing belt 114 is stretched across (wound across with tension applied) a driving pulley 112 and a driven pulley 113 which are rotated by a main scanning motor 111. By forward and backward rotations of this main scanning motor 111, a reciprocating movement of the carriage 101 is caused.

Meanwhile, in order to convey a recording sheet P set in the sheet feeding cassette 106 below the liquid droplet discharge head 20, a sheet feeding roller 115, a friction pad 116, a guide member 117, a conveying roller 118, and a conveying roller 119 are provided. The sheet feeding roller 115 and the friction pad 116 have a function of separating and feeding a recording sheet P from the sheet feeding cassette 106, the guide member 117 has a function of guiding the recording sheet P, and the conveying roller 118 has a function of reversing and conveying the recording sheet P that has been fed. Furthermore, the conveying roller 119 is pressed against the peripheral surface of the conveying roller 118, and a leading end roller 120 is for defining the angle of sending out the recording sheet P from the conveying roller 118.

The conveying roller 118 is rotated by a sub-scanning motor 121 via a gear train. There is provided a print receiving member 122, which is a recording sheet guide member for guiding the recording sheet P below the liquid droplet discharge head 20, which is sent out from the conveying roller 118 in accordance with the movement range of the carriage 101 in the main-scanning direction Y. At the downstream side in the sheet conveying direction of this print receiving member 122, a conveying roller 123 and a spur 124 are provided, which are rotated for sending out the recording sheet P in the sheet eject direction. Furthermore, a sheet eject roller 125 and a spur 126 for sending out the recording sheet P to the sheet eject tray 108, and guide members 127, 128 for forming a sheet eject path, are disposed (meaning being arranged and provided or being provided by determining the position).

At the time of recording, by driving the liquid droplet discharge head 20 in accordance with image signals while moving the carriage 101, ink is discharged onto a stopped recording sheet P to record one line, and then after conveying the recording sheet P by a predetermined amount, the next line is recorded. When a recording end signal or a signal indicating that the trailing edge of the recording sheet P has reached the recording area, the recording operation is ended and the recording sheet P is ejected. Furthermore, at a position outside the recording area at the right edge side in the moving direction of the carriage 101, there is provided a recovery device 129 for recovering from a discharge failure of the liquid droplet discharge head 20. The recovery device 129 includes a capping unit, a suction unit, and a cleaning unit. During the print standby state, the carriage 101 is moved to the side of the recovery device 129, and the liquid droplet discharge head 20 is capped by the capping unit, so that the discharging outlet parts are maintained in a wet state to prevent discharge failures caused by the drying of ink. Furthermore, by discharging ink that is unrelated to recording in the middle of a recording process, the ink viscosity is fixed at all discharging outlets, and stable discharging properties are maintained.

When a discharging failure occurs, the discharging outlet (nozzle) of the liquid droplet discharge head 20 is sealed by the capping unit, air bubbles are suctioned together with ink from the discharging outlet by the suction unit through a tube, and ink and dirt adhering to the surface of the discharging outlet surface are removed by the cleaning unit. Accordingly, the discharging failure is recovered from. Furthermore, the ink that has been suctioned is discharged to a waste ink reservoir (not shown) disposed under the recording device main body 100A, and is suctioned and maintained by an ink suction body inside the waste ink reservoir.

According to the recording device 100 according to the present embodiment, a highly reliable liquid droplet discharge head 20 is installed, including a piezoelectric element 10 in which stress concentration hardly occurs even by being vibrated and which is highly resistant to cracks, and therefore a highly reliable recording device 100 having a long operating life can be provided. Furthermore, in the recording device 100, the liquid droplet discharge head 20 including an actuator unit is installed, and therefore stable ink droplet discharge properties are attained and the image quality is improved.

Note that also in the recording device 100 according to the fourth embodiment, the liquid droplet discharge head 20 to be installed is not limited to the above; it is needless to say that any of the liquid droplet discharge heads 20A through 20C according to modification examples 1 through 3 or the liquid droplet discharge head 20D according to the second embodiment may be applied.

In the above description, the liquid droplet discharge head 20 is used in the recording device 50, 100; however, the above described liquid droplet discharge heads 20 and 20A through 20D may also be applied to a device for discharging liquid droplets other than ink, for example, a liquid resist for patterning.

The piezoelectric element, the liquid droplet discharging head, the liquid droplet discharging device, the image forming apparatus, and the manufacturing method of a piezoelectric element are not limited to the specific embodiments described herein, and variations and modifications may be made, such as appropriately combining the embodiments and modifications, without departing from the spirit and scope of the present invention. It is obvious to those skilled in the art that various embodiments and modifications may be constituted according to requirements and purposes.

The image forming apparatus according to an embodiment of the present invention is not limited to the recording devices 50, 100; any image forming apparatus of a liquid discharging method by the liquid discharging head according to an embodiment of the present invention is applicable. For example, a recording device including a printer, a plotter, a word processor, a facsimile machine, a copier, or a multifunction peripheral in which a plurality of these functions are combined, is also applicable as an image forming apparatus.

The application field of an embodiment of the present invention includes applications such as the printing field, particularly the digital printing field, and as an image forming apparatus, there are a digital printing device using a multifunction printer (MFP), a printer used in offices and used personally, and a multifunction peripheral (MFP). Furthermore, as an application field, the present embodiment is also applicable to a three-dimensional mold making technology using an inkjet technology.

Furthermore, the recording medium is not limited to the recording sheet P; the recording medium may include all kinds of recording media on which images can be formed by using a liquid droplet discharging head, including a usable thin sheet, cardboard, a postcard, an envelope, and an OHP sheet.

According to one embodiment of the present invention, a piezoelectric element is provided, in which stress concentration hardly occurs even by being vibrated and which is highly resistant to cracks.

The present application is based on and claims the benefit of priority of Japanese Priority Patent Application No. 2013-212155, filed on Oct. 9, 2013, the entire contents of which are hereby incorporated herein by reference.

What is claimed is:

1. A piezoelectric element comprising:
   a vibration plate;
   a lower electrode;
   a piezoelectric film; and
   an upper electrode, wherein
   the vibration plate, the lower electrode, the piezoelectric film, and the upper electrode are laminated in the stated order,
   an electric field is applied to the piezoelectric film by the lower electrode and the upper electrode,
   a shape of the piezoelectric film near a boundary face between the piezoelectric film and the upper electrode as viewed from a lamination direction of the piezoelectric film and the upper electrode, is substantially the same as a shape of the upper electrode,
   a width of the piezoelectric film extends from an end of the boundary face, and
   edge portions of the upper electrode have a concavely curved shape such that a thickness of the upper electrode tapers outwardly along the edge portions.

2. The piezoelectric element according to claim 1, wherein a thickness of the upper electrode is formed to become gradually less from an edge part of the upper electrode toward an upper electrode end.

3. The piezoelectric element according to claim 1, wherein the shape of the piezoelectric film positioned near the boundary face between the piezoelectric film and the upper electrode, is a curved shape.

4. The piezoelectric element according to claim 1, wherein the width of the piezoelectric film is formed to have a slope that extends from the upper electrode toward the lower electrode.

5. A liquid droplet discharging head comprising:
the piezoelectric element according to claim 1.

6. A liquid droplet discharging device comprising:
the liquid droplet discharging head according to claim 5; and
a tank configured to store liquid to be supplied to the liquid droplet discharging head.

7. An image forming apparatus comprising:
the liquid droplet discharging head according to claim 5.

8. A method of manufacturing the piezoelectric element according to claim 1, comprising:
forming the piezoelectric film and the upper electrode; and
subsequently performing over-etching when etching the upper electrode such that the piezoelectric film is also etched, to form a desired shape.

9. An image forming apparatus comprising:
the liquid droplet discharging device according to claim 6.

10. The piezoelectric element according to claim 1, wherein
in a thickness direction of the piezoelectric film, a ratio of a length from the boundary face between the upper electrode and the piezoelectric film to an edge of the piezoelectric film, with respect to a thickness of the piezoelectric film, is less than or equal to 10%.

11. A piezoelectric element comprising:
a vibration plate;
a first electrode;
a piezoelectric film; and
a second electrode, wherein
the piezoelectric film is located between the first electrode and the second electrode, and the first electrode and the piezoelectric film are located between the vibration plate and the second electrode,
an electric field is applied to the piezoelectric film by the first electrode and the second electrode,
a shape of the piezoelectric film near a boundary between the piezoelectric film and the second electrode as viewed from a lamination direction of the piezoelectric film and the second electrode, is substantially the same as a shape of the upper electrode,
the piezoelectric film widens away from a perimeter of the boundary, and
the second electrode includes a first face and a second face, the first face in contact with the piezoelectric film, the second face located opposite the first face, the second face being smaller in area than the first face, side surfaces between the first face and the second face being concave.

12. The piezoelectric element according to claim 11, wherein the side surfaces are oriented with respect to the first face and the second face such that a thickness of the second electrode tapers outwardly along the side surfaces.

13. The piezoelectric element according to claim 11, wherein the side surfaces are concavely curved.

14. A piezoelectric element comprising:
a vibration plate;
a first electrode;
a piezoelectric film; and
a second electrode, wherein
the piezoelectric film is located between the first electrode and the second electrode, and the first electrode and the piezoelectric film are located between the vibration plate and the second electrode,
an electric field is applied to the piezoelectric film by the first electrode and the second electrode,
a shape of the piezoelectric film near a boundary between the piezoelectric film and the second electrode as viewed from a lamination direction of the piezoelectric film and the second electrode, is substantially the same as a shape of the upper electrode,
the piezoelectric film widens away from a perimeter of the boundary, and
the second electrode includes a first face and a second face, the first face in contact with the piezoelectric film, the second face located opposite the first face, the second face being smaller in area than the first face, side surfaces between the first face and the second face being concave,
a ratio of a distance between the boundary face and an edge of the piezoelectric film, in a thickness direction of the piezoelectric film, to a thickness of the piezoelectric film is less than or equal to 10%.

\* \* \* \* \*